(12) United States Patent
Cang

(10) Patent No.: US 7,230,499 B2
(45) Date of Patent: Jun. 12, 2007

(54) RING OSCILLATOR WITH CONSTANT 50% DUTY CYCLE AND GROUND-NOISE INSENSITIVE

(75) Inventor: Ji Cang, Kirchheim/Teck (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 97 days.

(21) Appl. No.: 11/191,830

(22) Filed: Jul. 28, 2005

(65) Prior Publication Data

US 2007/0013454 A1    Jan. 18, 2007

(30) Foreign Application Priority Data

Jul. 18, 2005    (EP) ................... 05392010

(51) Int. Cl.
*H03B 5/24*    (2006.01)
(52) U.S. Cl. ........................................ 331/57; 331/175
(58) Field of Classification Search .................. 331/57, 331/74, 75, 175, 177 R
See application file for complete search history.

(56) References Cited

U.S. PATENT DOCUMENTS

| | | | |
|---|---|---|---|
| 5,744,992 A * | 4/1998 | Baumann | 327/241 |
| 5,869,992 A * | 2/1999 | Sekino | 327/276 |
| 6,181,123 B1 * | 1/2001 | Jou et al. | 323/351 |
| 6,650,191 B2 | 11/2003 | Branch et al. | 331/57 |
| 6,683,504 B1 | 1/2004 | Abernathy | 331/57 |
| 6,727,764 B2 * | 4/2004 | Manku et al. | 331/57 |
| 6,825,644 B2 * | 11/2004 | Kernahan et al. | 323/283 |
| 6,828,866 B2 | 12/2004 | Liu | 331/57 |
| 6,917,224 B2 * | 7/2005 | Han | 327/105 |

* cited by examiner

*Primary Examiner*—David Mis
(74) *Attorney, Agent, or Firm*—Saile Ackerman LLC; Stephen B. Ackerman

(57) ABSTRACT

Methods and circuits for chain ring oscillators having a constant duty cycle and being insensitive to ground noise have been disclosed. The ring oscillator generates n outputs with 360°/n phase shift and each stage is delayed by $$\frac{T}{2 \times n}.$$

The output of a suitable stage is selected so that a digital XOR-gate, using the output of a selected stage and the output of the nth stage, eliminates variations of the duty cycle caused by temperature and process variations. In case a 50% duty cycle is desired the stage number N of the selected stage can be calculated using the equation N=(n−1)/2. The duty cycle can be varied by selecting the output of another gate. A D-flipflop, clocked by the output of the XOR-gate removes noise from the clock pulses.

19 Claims, 4 Drawing Sheets

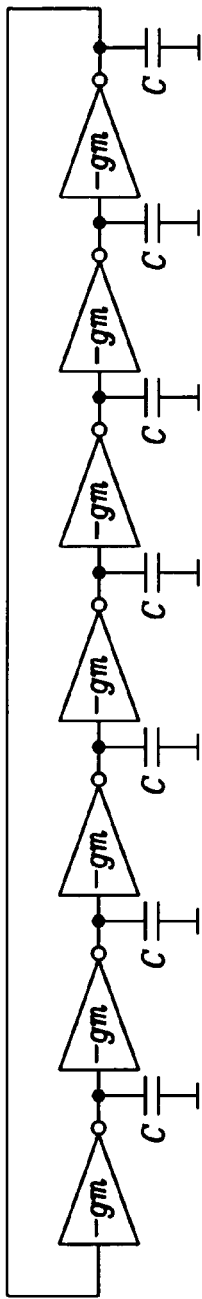
FIG. 1 – Prior Art
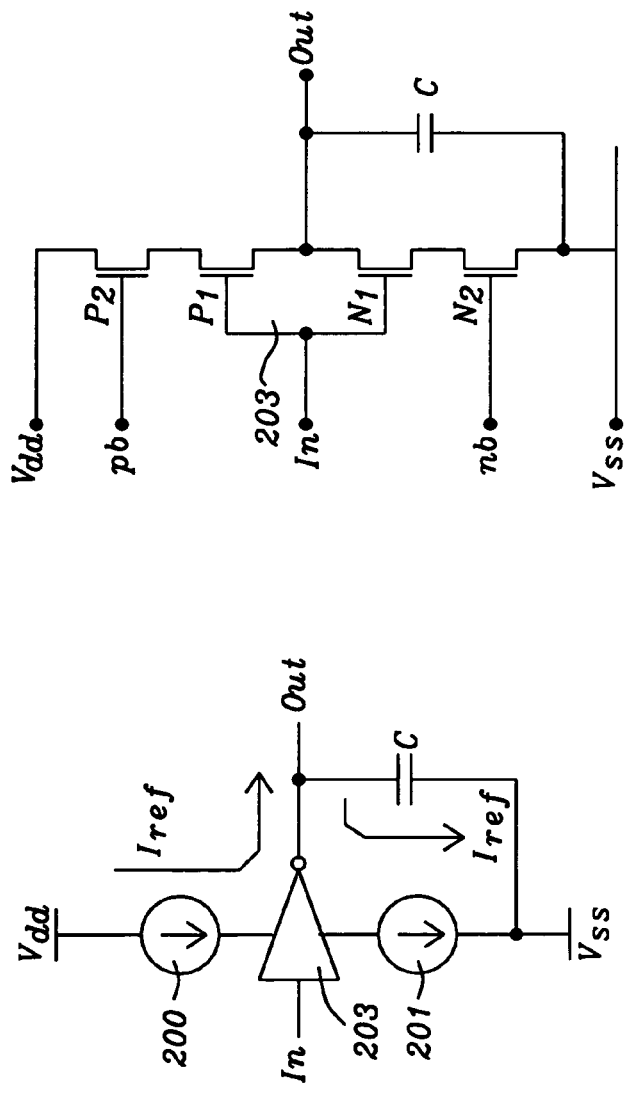
FIG. 2b
FIG. 2c

RING OSCILLATOR WITH CONSTANT 50% DUTY CYCLE AND GROUND-NOISE INSENSITIVE

BACKGROUND OF THE INVENTION (1) Field of the Invention

This invention relates generally to ring oscillator circuits and relates more particularly to a CMOS on-chip chain ring oscillator being insensitive to ground noise and having a constant 50% duty cycle over temperature and process variations.

(2) Description of the Prior Art

Ring oscillators are used for a variety of purposes. Usually ring oscillators are used as an internally generated clocking source, or as a stage in a more complex system such as a voltage controlled oscillator (VCO) or a phase locked loop (PLL).

FIG. 1 prior art shows a block diagram of a 7-stage CMOS inverter chain ring oscillator. Normally the number of stages is an odd number with the output of the cascade fed back to the input of the inverter chain. An oscillator provides an output at a specific frequency with no input signal required. The frequency of the oscillator shown at FIG. 1 prior art is completely dependent on the inherent inverter time delay and is therefore not externally controllable.

Each stage of the ring oscillators shown in FIG. 1 prior art has a unity voltage gain and 360/7 degrees of phase shift.

It is obvious that any noise from any source is spreading through the oscillator and that changes of the temperature impacts the electrical properties of the inverter stages and hence impacts frequency and duty cycles of the ring oscillator.

It is a challenge for the engineers to build ring oscillators being insensitive in regard of noise and changes of temperature.

There are patents known in the area of ring oscillators:

U.S. Pat. No. 6,828,866 to Liu teaches a ring oscillator circuit, such as a VCO, with a relatively high level of noise rejection for noise originating from both the voltage supply and ground. The ring oscillator circuit is composed of a plurality of differential delay circuits, each differential delay circuit generating a differential output signal that is a delayed (and preferably inverted) version of a differential input signal. Each differential delay circuit includes first and second input transistors for receiving the differential input signal. Each differential delay circuit also includes first and second load transistors coupled in parallel with the respective first and second input transistors. Each differential delay circuit further includes a first current source coupled between the first input transistor and a first power supply terminal (e.g., a voltage supply terminal), a second current source coupled between the second input transistor and the first power supply terminal and a third current source coupled between the first and second input transistors and a second power supply terminal (e.g., a ground terminal). The first and second current sources reduce the coupling of noise from the first power supply terminal to the output. The third current source reduces the coupling of noise from the second power supply terminal to the output.

U.S. Pat. No. 6,683,504 to Abernathy discloses a ring oscillator integrated circuit comprising a plurality of parallelly arranged ring oscillator sections, where a ring oscillator section can be any conventional ring oscillator circuit. That is, the inputs and the outputs of a plurality of conventional ring oscillators are connected together. Since each ring oscillator section output signal includes random noise, the parallel arrangement of ring oscillators, and the summing of several oscillator signals, causes at least some noise cancellation. As a result, a lower noise oscillator signal is supplied. A method of reducing random noise in a ring oscillator circuit is also provided.

U.S. Pat. No. 6,650,191 to Branch et al. discloses a low power and low jitter CMOS ring oscillator having a novel architecture that includes fully symmetrical differential current steering delay cells. This novel ring oscillator includes a first capacitor coupled between the first power supply rail and a bias voltage input. At least one stage couples across the first capacitor. Each stage includes a first transistor, a second capacitor, and a fully symmetrical differential delay cell. In an embodiment, the first transistor may be a PMOS transistor, where the drain of the first PMOS transistor connects to the first power supply rail and the gate of the first PMOS transistor couple to the bias voltage input. The second capacitor couples between the source of the first transistor and ground and acts as a low pass filter. As a result, the second capacitor minimizes the effects of the thermal and flicker noise of the devices, which provide the tail current. The fully symmetrical differential delay cell includes a control input, a differential input and a differential output. The control input couples to the source of the first PMOS transistor. When one stage is present, the differential input couples to the differential output. When more than one stage is present, the differential outputs couple to the differential inputs of the concurrent delay cell. In addition, the delay cell in the last stage couples to the differential input of the delay cell in the first stage.

SUMMARY OF THE INVENTION

A principal object of the present invention is to achieve a ring oscillator having a constant duty cycle over temperature and process variations.

A further object of the invention is to achieve a ring oscillator being insensitive to ground noise In accordance with the objects of this invention a method to achieve ground noise insensitivity and a constant duty-cycle of chain ring oscillators over temperature and process variations has been achieved. The method comprises, first, the provision of a chain ring oscillator having n-stages and a clocked means to remove noise from clock pulses. The next steps of the method are to select the output of a stage of the ring oscillator wherein such a phase shift between said stage and the nth stage exists that a subtraction of both outputs eliminates any duty cycle variations due to process and temperature variations, to generate a signal being the result of a subtraction of the output of the stage selected in the previous step from the output of the nth stage, and to clock with the signal generated in the previous step a means to remove noise from clock pulses from the output of the nth stage of the ring oscillator. The last step is to buffer the signal, after noise has been removed in the previous step, to provide the final clock signal of the ring oscillator.

In accordance with the objects of this invention a chain ring oscillator to achieve a constant duty-cycle over temperature and process variations has been achieved. This chain ring oscillator comprises, first, n identical cascaded stages of inverters, a system current source generating a reference current, wherein a first terminal is connected to $V_{DD}$ voltage and a second terminal is connected to a means to generate two reference currents. Furthermore the ring oscillator comprises said means to generate two reference currents wherein a first reference current is provided to control each of said first current sources of each of said inverter stages and a second reference current is provided to control each of said second current sources of each of said inverter stages, and, being the key of the invention, a circuit to stabilize the duty cycle and to remove noise from the clock pulses by subtracting the output of a suitable stage from the output of the last stage.

In accordance with the objects of this invention a circuit to stabilize the duty cycle and to remove noise from the clock pulses of an n-stage chain ring oscillator by subtracting the output of a suitable stage from the output of the last stage of said ring oscillator, wherein said suitable stage is having a phase shift to the nth stage in a way that a subtraction of both inputs can eliminate variations of the duty-cycle of said ring oscillator, has been achieved. This circuit invented comprises, first, a first inverter, wherein its input is said output of the nth-stage of the ring oscillator and its output is the input of a third inverter and of a first input of a means to subtract signals, a second inverter, wherein its input is said output of said stage having such a phase shift to the nth-stage that a subtraction can eliminate variations of duty cycle and its output is a second input of a means to subtract signals, and a third inverter, wherein its input is said output of said first inverter and its output is an input of a clocked means to remove noise from clock pulses. Furthermore the circuit invented comprises said means to subtract signals having two inputs and an output wherein a first input is the output of said first inverter, a second input is the output of said second inverter and its output is the clock input of said clocked means to remove noise from clock pulses, said clocked means to remove noise from clock pulses having two inputs and an output, wherein a first input is the output of said third inverter, a second input is the output of said means to subtract signals, and the output is the input to a means to buffer signals, and said means to buffer signals having an input and an output wherein its input is the output of said means clocked means to remove noise from clock pulses and its output is the final output of said ring oscillator.

BRIEF DESCRIPTION OF THE DRAWINGS

In the accompanying drawings forming a material part of this description, there is shown:

FIG. 1 prior art shows the architecture of a chain ring oscillator

FIG. 2b shows the basic functional components of one of the identical stages of the chain ring oscillator.

FIG. 2c shows correspondent circuit components to the stage shown in FIG. 2b

DESCRIPTION OF THE PREFERRED EMBODIMENTS

The preferred embodiments disclose a CMOS on-chip chain ring oscillator having a constant duty-cycle over temperature and process variations.

Figure 2A:
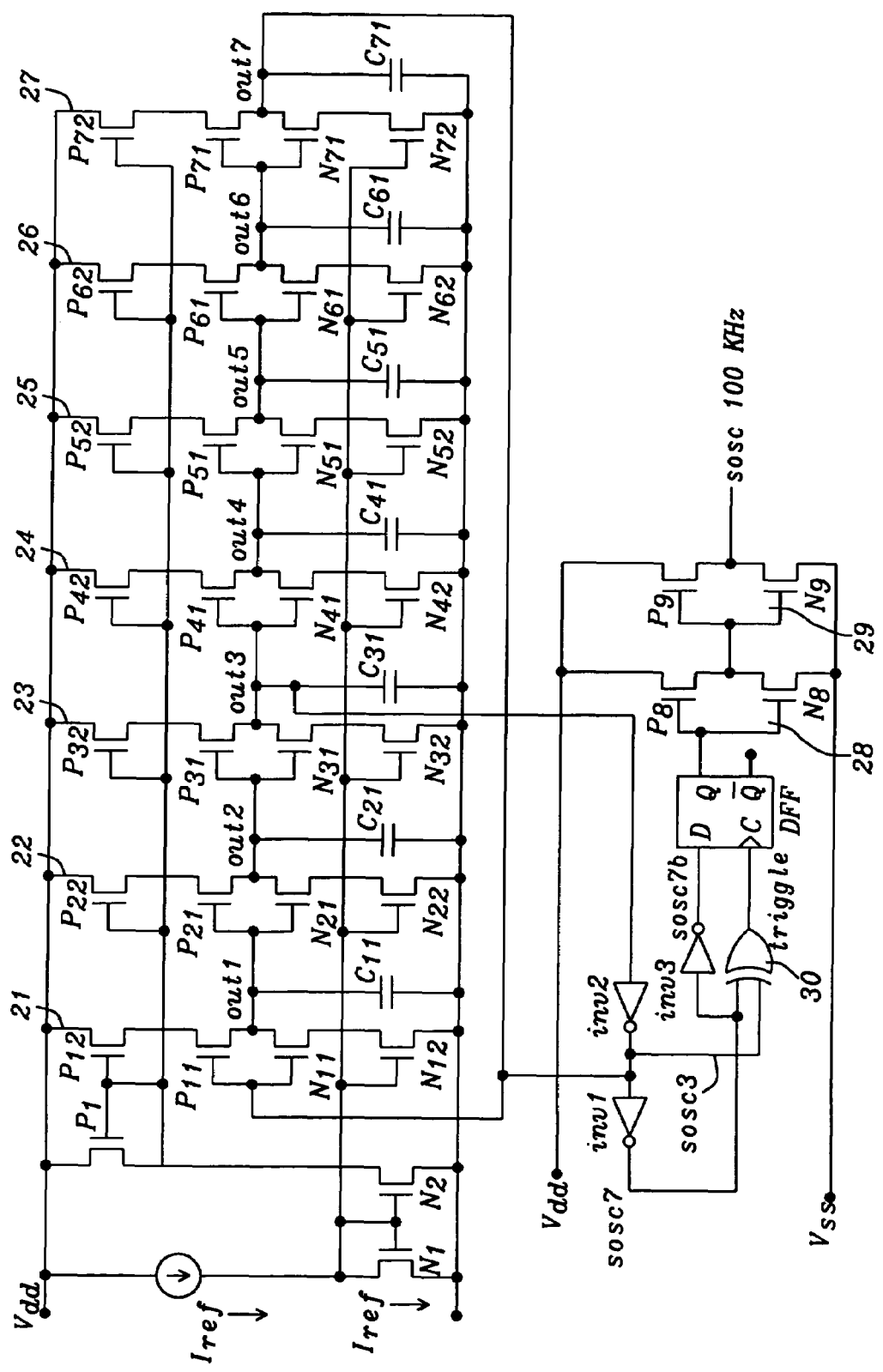
FIG. 2a shows a schematic of the circuit of a preferred embodiment of the present invention, a 100 KHz clock chain ring oscillator having a constant duty cycle of 50%.

FIG. 2a shows a schematic of the circuit of a preferred embodiment of the present invention, a 100 KHz clock generator having a constant duty cycle of about 50%. This preferred embodiment is described in detail now.

This ring oscillator comprises seven identical stages 21–27. Each stage has about unity voltage gain gm and 360°/7 phase shift.

FIG. 2b shows the basic functional components of one of the identical stages and FIG. 2c shows correspondent circuit components to the stage shown in FIG. 2b.

Writing the open-loop transfer function of the circuit shown in FIG. 2a we have $$H(j*\omega) = \frac{-gm*R}{1+j*\omega*R*C} = \frac{-gm*R}{1+j*\sqrt{7}*\frac{\omega}{\omega_0}};$$

$$\omega_0 = \frac{\sqrt{7}}{R*C}.$$

wherein R and C represent the output resistance and the load capacitance of one stage, respectively, and (gm*R) is the gain required for steady oscillations.

Writing the total open-loop transfer function of the circuit of FIG. 2a:

$$H(j*\omega) = \left(\frac{(-gm*R)^7}{\left(1+j*\sqrt{7}*\frac{\omega}{\omega_0}\right)^7}\right)$$

The circuit of FIG. 2a oscillates if, at $w_0$, each stage has unity voltage gain and 360°/7 of phase shift. Imposing these two conditions, we have $$w_0 = \sqrt{7}\,/\,(R*C) \text{ and } gm*R = 2.$$

The factor R×C defines the sum of rise time plus fall time, represented by $T_{RF}$. The following equation is valid:

$$T_{RF} = R \times C = 2 \times \left(\frac{1}{gm}\right) \times C,$$

wherein C is the capacitance of the capacitor C shown in FIG. 2b and in FIG. 2c and gm is the unity gain of the amplifier 203 shown in FIG. 2b. The open-loop transfer function is thus given by $$H(j \times \omega) = \left[\frac{-2}{1+j \times 7^{0.5} \times \frac{\omega}{\omega_0}}\right]^7$$

The ring oscillator of FIG. 2a has seven identical stages. FIG. 2b shows a block diagram of one of the stages 21–27 of the ring oscillator shown in FIG. 2a. FIG. 2b illustrates a current source 200, another current source 201, an inverting amplifier 203, having an input voltage $V_{IN}$ and an output voltage $V_{OUT}$, and a capacitor C.

FIG. 2c shows an embodiment of the circuitry of the stage shown in FIG. 2b. Transistor P2 corresponds to the current source 200 shown in FIG. 2b. Transistor N2 corresponds to the current source 201 shown in FIG. 2b. The inverter 200 of FIG. 2b has been realized by devices P1 and N1, constituting the transconductance:

$$gm = gm_{P1} + gm_{N1}$$
$$= \left(I_{DS} \times K_P \times \frac{W}{L}\right)_{P1} + \left(I_{DS} \times K_N \times \frac{W}{L}\right)_{N1},$$

wherein $K_P$ is a CMOS process constant of the P1 PMOS transistor, $K_N$ is a correspondent CMOS constant of the NMOS transistor N1, $I_{DS}$ is the drain-source current in saturation of the device. The factors W and L represent the width and the length of the correspondent transistors P1 and N1. The gate drives of the added transistors N2 and P2 allow control of the drain-source current of the inverter, thus controlling the rise and fall time $T_{RF}$ according to the equation:

$$T_{RF} = 2 \times \frac{1}{gm} \times C_1 = \frac{1}{I_{REF}} \times \frac{2 \times C1}{\left(K_P \times \frac{W}{L}\right)_{P1} + \left(K_N \times \frac{W}{L}\right)_{N1}},$$

wherein $K_P$ is a CMOS process constant of the P1 PMOS transistor, $K_N$ is a correspondent CMOS constant of the NMOS transistor N1, $I_{REF}$ is the current through transistors P2 and N2. The factors W and L represent the width and the length of the correspondent transistors P1 and N1.

In regard of the circuit shown in FIG. 2a the diode connected transistor N1 mirrors the reference current $I_{REF}$ of e.g. 2 µA to transistor N2 and to the additional N-type transistors of all stages. The diode connected transistor P1 mirrors then $I_{REF}$ to the additional P-type transistors of all stages.

The seven stages 21 to 27 of the circuit of FIG. 2a are generating 7 outputs with 360°/7 phase shift wherein the rise and fall times of each stage is delayed by $T_{RF}14$. The rise plus fall time of each stage of the preferred embodiment shown in FIG. 2a is equal 714.3 nsec+714.3 nsec. The output clock period $T_{out7}$ is therefore 7×(714.3 nsec+714.3 nsec)=10 µsec. This corresponds to 100 KHz.

The output signal out7 of the seventh stage is fed back to the P1/N11 inverter of the first stage.

There are two problems connected with this approach so far:
1. The "out7" signal has long rise/fall edges. If "out7" signal would be passing through inverters before being provided as output clock signal ground-noise through the capacitors C11 to C71 of the seven stages 21–27 would appear on long rise/fall edges, producing spikes of the clock signals (as shown with sosc7b in FIG. 3).
2. The threshold voltage of these inverters is process and temperature dependent, the duration of a duty cycle converted from the rise/fall edges would be then:

$T_{DUTY}(\text{out7})=0.5 \times T_{RF} \pm \Delta T,$ wherein $\Delta T$ is the variation of the duration of a duty cycle caused by variations of temperature.

In order to solve the two problems mentioned above the inverter inv1 converts the signal out7 to the signal sosc7, which is converted by the inverter inv3 to the signal sosc7b.

A digital XOR-gate 30 generates a signal "triggle" from signals sosc7 and sosc3. Signal sosc3 is inverted from the signal out3, which is the output signal of the third stage 23 of the ring oscillator shown in FIG. 2a. It is obvious the sosc7 signal has the same frequency and duty cycle as out7 and sosc3 has the same frequency and duty cycle as out3. The ring oscillator generates 7 outputs with 360°/7 phase shift so that the rise and fall times of each stage are delayed by T/14. The rise-edge of "triggle" is $3 \times T_{RF}/14$ delayed to the rise and fall edge of the sosc7 signal. A clocked D-flip-flop DFF is clocked by the rise edge of the "triggle" signal. The output signal of the D-flipflop DFF equals its input data signal when its clock changes from 0 to 1.

As shown above the duration of a duty cycle of signal out7 is:

$T_{DUTY}(\text{out7})=0.5 \times T_{RF} \pm \Delta T,$

The time period of a duty cycle of signal out3 is:

$T_{DUTY}(\text{out3})=0.5 \times (T_{RF} - T_{DELAY}) \pm \Delta T,$ wherein $$T_{DELAY} = 3 \times 0.5 \times \frac{120}{360} \times T_{RF}.$$

This means that the signal "triggle" which has been XORed from duty cycle $T_{DUTY}$ (out3) and from duty cycle $T_{DUTY}$ (out7) corresponds to a time period $T_{DUTY}$ of its duty cycle:

$T_{DUTY}(\text{triggle})=T_{DUTY}(\text{out7})-T_{DUTY}(\text{out3})=0.5 \times T_{RF} \pm \Delta T - 0.5 \times (T_{RF} - T_{DELAY}) \pm \Delta T$ or $T_{DUTY}(\text{triggle})=0.25 \times T_{RF}.$ This means the duty cycle of the "triggle" signal is constant. The influence of the variations $\Delta T$ of the duty cycle due to variations of temperature has been eliminated. Therefore the duty cycle of the final clock "sosc100 kHz" is also constant with 50%.

It has to be understood that using the principles of the present invention a ring oscillator having any odd number of stages with a minimum of five stages could be built as well.

In this case the "triggle" is

"triggle"=[out(N)]-{out[(N-1)/2]}, wherein N is the number of stages. The "clocked" output corresponds to the output of the Nth stage. In the example described above the ring oscillator has N=7 stages and the output of the third stage is used to generate the triggle pulses by subtraction from the output of the last stage, wherein a duty cycle of 50% is established Furthermore it has to be understood that the preferred embodiment of the present invention having a duty cycle of 50% is an example only. Using the principles of the present invention a ring oscillator having any other duty cycle could be implemented as well.

In order to implement another duty cycle of the preferred embodiment of the present invention:

$T\text{duty}(\text{triggle}X)=T_{DUTY}(\text{out}N)-T_{DUTY}(\text{out}X)$ can be introduced, wherein X defines a suitable stage of the ring oscillator wherein X<N, wherein N is the total number of stages of the ring oscillator. As described above the output of this suitable stage X is XORed with the output of the last stage to generate triggle pulses having a desired duty cycle.

Figure 3:
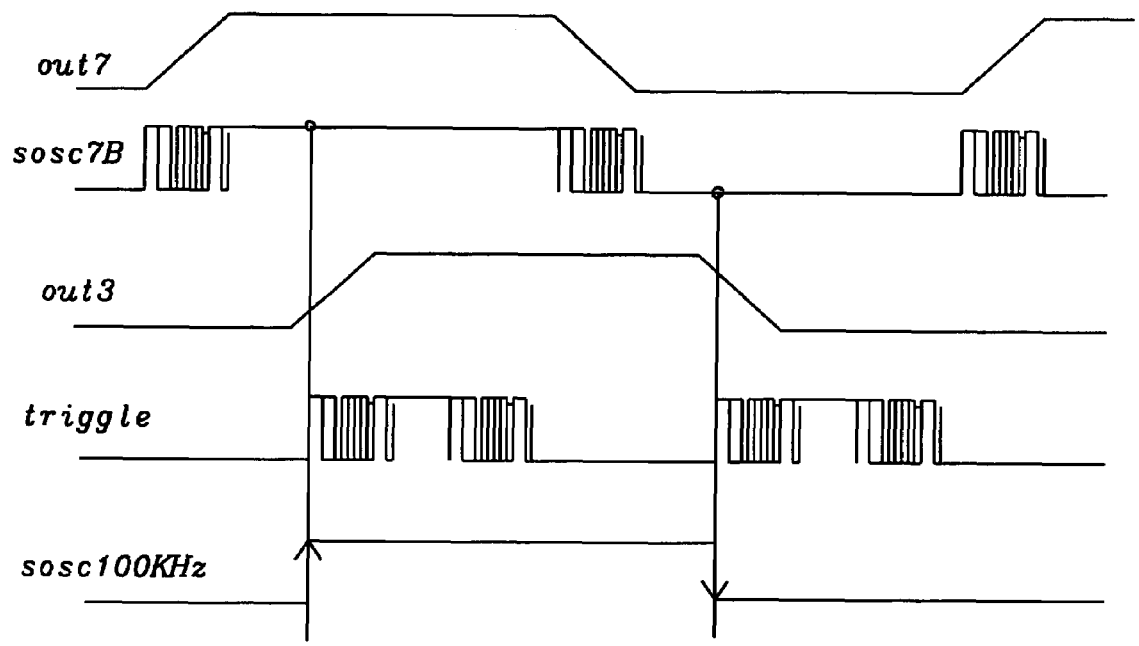
FIG. 3 shows the waveforms of some significant signals of the circuit and the output signal of the ring oscillator "sosc100 kHz"

FIG. 3 shows the waveforms of the signals of the preferred embodiment of the circuit shown in FIG. 2a out7, sosc7b, out3, triggle and the output signal of the ring oscillator "sosc100 kHz". The signal sosc7b, generated by the out7 signal, is clocked by the triggle signal, which has a duty cycle that is delayed by factor 0.25 of the duty cycle of Tduty (out7). Therefore the output signal "sosc100kHz" is insensitive to ground noise.

The output signal of the D-flipflop DFF is buffered by the inverter 28, built by transistors P8/N8 and by the inverter 29, built by transistors P9/N9. The output signal of inverter 29 is the output signal of the ring oscillator of the present invention "sosc100 kHz".

It is obvious that by varying the capacitance values of the capacitors of the stages of the ring oscillators the frequency of the output signal could be modified. The varying of the capacitance can be corrected by varying the bias-current values of the reference.

Figure 4:
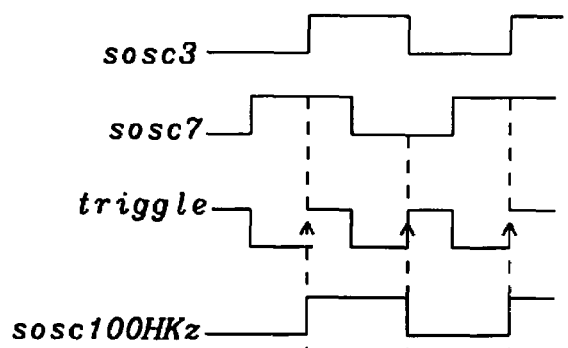
FIG. 4 shows the waveforms of the most significant signals of the circuit and how they interrelate with the output signal of the ring oscillator "sosc100 kHz"

FIG. 4 illustrates shows the correlation of signals sosc3, sosc7, triggle and the output signal sosc100 kHz.

Figure 5:
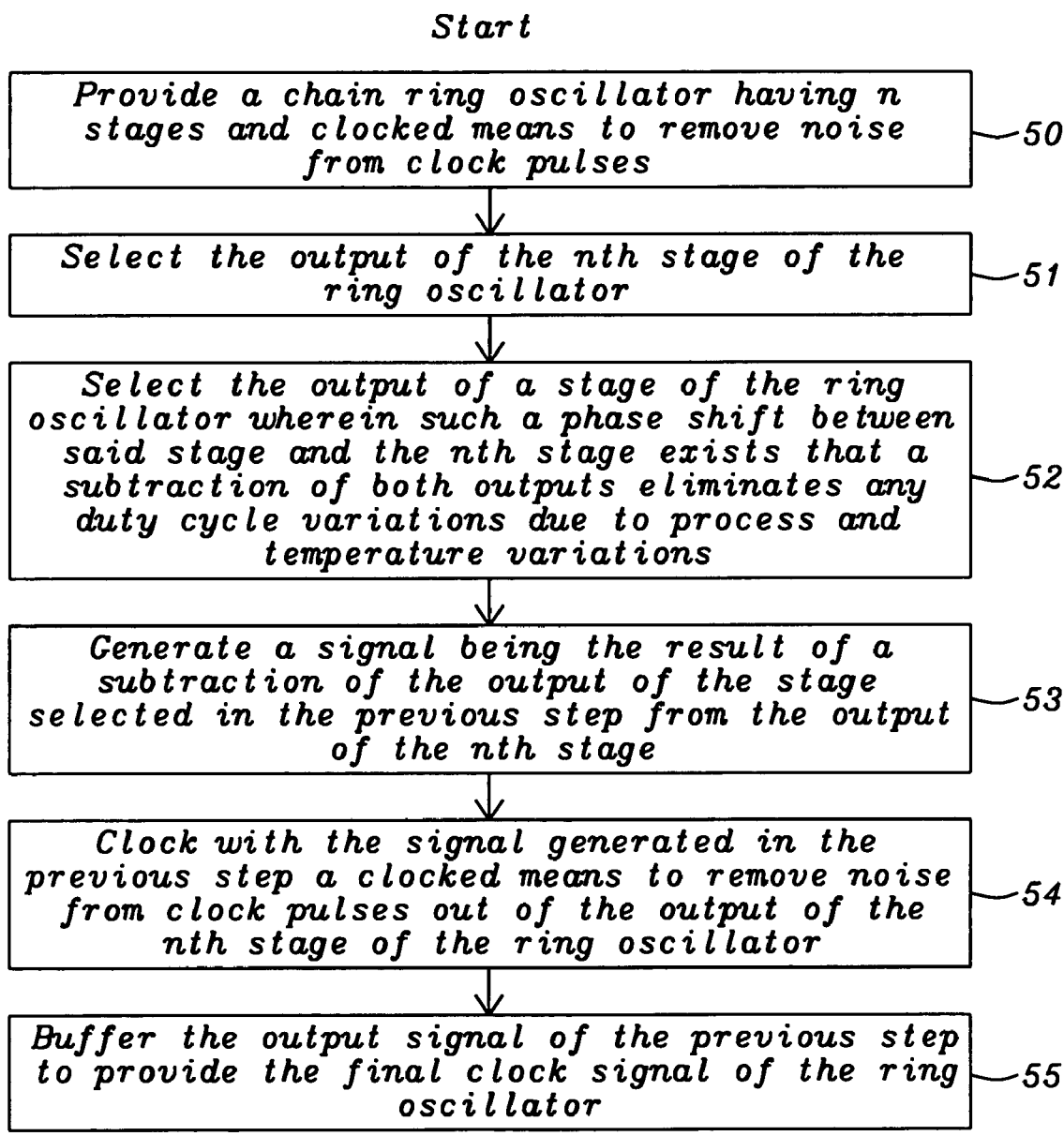
FIG. 5 shows a flowchart of a method for a chain ring oscillator to achieve ground noise insensitivity and a constant duty-cycle over temperature and process variations

FIG. 5 shows a flowchart of a method for a chain ring oscillator to achieve ground noise insensitivity and a constant duty-cycle over temperature and process variations. Step 50 describes the provision of a ring oscillator having n stages and of a clocked means to remove noise from clock pulses. The following step 51 illustrates the selection of the output of the nth stage of the ring oscillator and step 52 describes the selection of the output of a stage of the ring oscillator wherein such a phase shift between said stage and the nth stage exists that a subtraction of both outputs eliminates any duty cycle variations due to process and temperature variations. In the preferred embodiment described above the ring oscillator had 7 stages and the output of the third stage has been selected to eliminate duty cycle variations. In step 53 a signal is generated, which is the result of a subtraction of the output of the stage selected in the previous step from the output of the nth stage. In the following step 54 a clocked means to remove noise from clock pulses removes noise from the output of the nth stage of the ring oscillator is clocked with the signal generated in the previous step. The final step 55 illustrates that the signal, from which the noise has been removed in the previous step, is buffered to provide the final clock signal of the ring oscillator.

While the invention has been particularly shown and described with reference to the preferred embodiments thereof, it will be understood by those skilled in the art that various changes in form and details may be made without departing from the spirit and scope of the invention.

What is claimed is:

1. A method to achieve ground noise insensitivity and a constant duty-cycle of chain ring oscillators over temperature and process variations is comprising:
   provide a chain ring oscillator having n-stages and a clocked means to remove noise from clock pulses;
   select the output of a stage of the ring oscillator wherein such a phase shift between said stage and the nth stage exists that a subtraction of both outputs eliminates any duty cycle variations due to process and temperature variations;
   generate a signal being the result of a subtraction of the output of the stage selected in the previous step from the output of the nth stage;
   clock with the signal generated in the previous step a means to remove noise from clock pulses from the output of the nth stage of the ring oscillator; and
   buffer the signal, after noise has been removed in the previous step, to provide the final clock signal of the ring oscillator.

2. The method of claim 1 wherein said clocked means to remove noise from clock pulses is a D-flip-flop.

3. The method of claim 1 wherein said subtraction of two signals is performed using a logical XOR operation.

4. The method of claim 1 wherein said ring oscillator has N-stages, wherein N is an odd number and higher or equal to five, and the output of the (N−1)/2 stage has been selected to be subtracted form the output of the Nth stage.

5. The method of claim 1 wherein said ring oscillator has seven stages and the output of the third stage has been selected to be subtracted form the output of the seventh stage.

6. The method of claim 1 wherein the duty cycle of said ring oscillator can be varied by selecting the output of a suitable output stage to be subtracted from the last stage of said ring oscillator.

7. A chain ring oscillator to achieve a constant duty-cycle over temperature and process variations is comprising:
   n identical cascaded stages of inverters;
   a system current source generating a reference current, wherein a first terminal is connected to VDD voltage and a second terminal is connected to a means to generate two reference currents;
   said means to generate two reference currents wherein a first reference current is provided to control each of said first current sources of each of said inverter stages and a second reference current is provided to control each of said second current sources of each of said inverter stages; and
   a circuit to stabilize the duty cycle and to remove noise from the clock pulses by subtracting the output of a suitable stage from the output of the last stage.

8. The chain ring oscillator of claim 7 wherein said means to generate two reference currents comprises three transistors wherein a diode connected first transistor mirrors the reference current generated by said system current source to a second transistor and to each of said second current sources of each inverter stage and wherein the current through the second transistor is mirrored by said third transistor, which is diode connected, to each of said first current sources of each of said inverter stage.

9. The chain ring oscillator of claim 7 wherein each of said n stages is comprising:
   a first current source, wherein a first terminal is connected to VDD voltage and a second terminal is connected to a first power supply of an inverter;
   a second current source, wherein a first terminal is connected to VSS voltage and a second terminal is connected to a second power supply of said inverter;
   said inverter is having an input and an output, wherein its input is connected to the output of a previous stage and the input of the inverter of the first stage is connected to the output of the nth-stage and its output is connected to the input of the inverter of the following stage and to a second terminal of a capacitor; and
   said capacitor, wherein a first terminal is connected to VSS voltage and a second terminal is connected to the output of said inverter.

10. The chain ring oscillator of claim 7 wherein said circuit to stabilize the duty cycle and to remove noise from the clock pulses by subtracting the output of a suitable stage from the output of the last stage wherein said suitable stage is having a phase shift to the nth stage in a way that a subtraction of both inputs can eliminate variations of duty-cycle, is comprising:
- a first inverter, wherein its input is said output of the nth-stage of the ring oscillator and its output is the input of a third inverter and of a first input of a means to subtract signals;
- a second inverter, wherein its input is said output of said stage having such a phase shift to the nth-stage that a subtraction can eliminate variations of duty cycle and its output is a second input of a means to subtract signals;
- a third inverter, wherein its input is said output of said first inverter and its output is an input of a clocked means to remove noise from clock pulses;
- said means to subtract signals having two inputs and an output wherein a first input is the output of said first inverter, a second input is the output of said second inverter and its output is the clock input of said clocked means to remove noise from clock pulses;
- said clocked means to remove noise from clock pulses having two inputs and an output, wherein a first input is the output of said third inverter, a second input is the output of said means to subtract signals, and the output is the input to a means to buffer signals; and
- said means to buffer signals having an input and an output wherein its input is the output of said means clocked means to remove noise from clock pulses and its output is the final output of said ring oscillator.

11. The chain ring oscillator of claim 10 wherein said means to subtract signals is a digital XOR-gate.

12. The chain ring oscillator of claim 10 wherein said clocked means to remove noise from clock pulses is a digital D-flip-flop.

13. The chain ring oscillator of claim 10 having n stages, wherein the number N of said suitable stage, in case a 50% duty cycle is desired, can be calculated by the equation $N=(n-1)/2$.

14. The chain ring oscillator of claim 10 having n stages wherein the number N of said suitable stage is selected in a way to achieve a desired duty cycle.

15. A circuit to stabilize the duty cycle and to remove noise from the clock pulses of an n-stage chain ring oscillator by subtracting the output of a suitable stage from the output of the last stage of said ring oscillator, wherein said suitable stage is having a phase shift to the nth stage in a way that a subtraction of both inputs can eliminate variations of the duty-cycle of said ring oscillator, is comprising:
- a first inverter, wherein its input is said output of the nth-stage of the ring oscillator and its output is the input of a third inverter and of a first input of a means to subtract signals;
- a second inverter, wherein its input is said output of said stage having such a phase shift to the nth-stage that a subtraction can eliminate variations of duty cycle and its output is a second input of a means to subtract signals;
- a third inverter, wherein its input is said output of said first inverter and its output is an input of a clocked means to remove noise from clock pulses;
- said means to subtract signals having two inputs and an output wherein a first input is the output of said first inverter, a second input is the output of said second inverter and its output is the clock input of said clocked means to remove noise from clock pulses;
- said clocked means to remove noise from clock pulses having two inputs and an output, wherein a first input is the output of said third inverter, a second input is the output of said means to subtract signals, and the output is the input to a means to buffer signals; and
- said means to buffer signals having an input and an output wherein its input is the output of said means clocked means to remove noise from clock pulses and its output is the final output of said ring oscillator.

16. The circuit of claim 15 wherein said means to subtract signals is a digital XOR-gate.

17. The circuit of claim 15 wherein said clocked means to remove noise from clock pulses is a digital D-flip-flop.

18. The chain ring oscillator of claim 15 having n stages, wherein the number N of said suitable stage, in case a 50% duty cycle is desired, can be calculated by the equation $N=(n-1)/2$.

19. The chain ring oscillator of claim 15 having n stages wherein the number N of said suitable stage is selected in a way to achieve a desired duty cycle.

* * * * *

UNITED STATES PATENT AND TRADEMARK OFFICE
CERTIFICATE OF CORRECTION

PATENT NO. : 7,230,499 B2  Page 1 of 1
APPLICATION NO. : 11/191830
DATED : June 12, 2007
INVENTOR(S) : Cang Ji It is certified that error appears in the above-identified patent and that said Letters Patent is hereby corrected as shown below:

On Title Page
In the Inventor, item (75), delete, "Ji Cang, Kirchheim/Teck (DE)" and replace with -- Cang Ji, Kirchheim/Teck (DE) --.

Signed and Sealed this

Seventh Day of August, 2007

JON W. DUDAS
*Director of the United States Patent and Trademark Office*